(12) United States Patent
Kato

(10) Patent No.: US 12,519,455 B2
(45) Date of Patent: Jan. 6, 2026

(54) FILTER DEVICE, RADIO-FREQUENCY MODULE, AND COMMUNICATION DEVICE

(71) Applicant: Murata Manufacturing Co., Ltd., Nagaokakyo (JP)

(72) Inventor: Masanori Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 217 days.

(21) Appl. No.: 18/210,136

(22) Filed: Jun. 15, 2023

(65) Prior Publication Data
US 2023/0327648 A1 Oct. 12, 2023

Related U.S. Application Data

(63) Continuation of application No. PCT/JP2021/047555, filed on Dec. 22, 2021.

(30) Foreign Application Priority Data

Dec. 28, 2020 (JP) .................................. 2020-219306

(51) Int. Cl.
*H03H 9/60* (2006.01)
*H03H 9/13* (2006.01)
(Continued)

(52) U.S. Cl.
CPC ............ *H03H 9/605* (2013.01); *H03H 9/133* (2013.01); *H03H 9/205* (2013.01); *H03H 9/542* (2013.01)

(58) Field of Classification Search
CPC ........ H03H 9/605; H03H 9/133; H03H 9/205; H03H 9/542; H03H 9/0542; H03H 9/568;
(Continued)

(56) References Cited

U.S. PATENT DOCUMENTS 7,276,994 B2 * 10/2007 Takeuchi ............. H03H 9/0095
310/346
2005/0174192 A1 8/2005 Kawamura
(Continued)

FOREIGN PATENT DOCUMENTS

JP 06152299 A 5/1994
JP 07283688 A 10/1995
(Continued)

OTHER PUBLICATIONS

International Search Report in PCT/JP2021/047555, mailed Mar. 22, 2022, 3 pages.
(Continued)

*Primary Examiner* — John W Poos
(74) *Attorney, Agent, or Firm* — Keating & Bennett, LLP

(57) ABSTRACT

A filter device includes a filter substrate and a ladder filter at the filter substrate. The ladder filter includes at least one inductor and acoustic wave resonators including a series arm resonator and a parallel arm resonator. The at least one inductor is coupled to the acoustic wave resonators. A pass bandwidth of the ladder filter is larger than a resonance bandwidth of at least one of the acoustic wave resonators. The series arm resonator includes a first piezoelectric substrate. The parallel arm resonator includes a second piezoelectric substrate that is different from the first piezoelectric substrate.

11 Claims, 9 Drawing Sheets

(51) Int. Cl.
*H03H 9/205* (2006.01)
*H03H 9/54* (2006.01)

(58) Field of Classification Search
CPC ...... H03H 9/6483; H03H 9/706; H03H 9/725; H03H 9/02; H04B 1/38
See application file for complete search history.

(56) References Cited

U.S. PATENT DOCUMENTS

| | | | |
|---|---|---|---|
| 2008/0197941 A1 | 8/2008 | Suzuki et al. | |
| 2009/0058555 A1* | 3/2009 | Takata | H03H 9/0576 333/129 |
| 2013/0033337 A1* | 2/2013 | Nishihara | H03H 9/706 333/133 |
| 2014/0009240 A1* | 1/2014 | Nagai | H03H 9/0095 333/5 |
| 2015/0188512 A1 | 7/2015 | Michigami | |
| 2015/0341016 A1* | 11/2015 | Iwaki | H03H 9/02228 333/133 |
| 2018/0152169 A1* | 5/2018 | Goto | H03H 9/02574 |
| 2020/0212866 A1* | 7/2020 | Matsubara | H03H 7/175 |

FOREIGN PATENT DOCUMENTS

| | | |
|---|---|---|
| JP | 2005260915 A | 9/2005 |
| JP | 2008205947 A | 9/2008 |
| JP | 2009212567 A | 9/2009 |
| WO | 2014050219 A1 | 4/2014 |

OTHER PUBLICATIONS

Written Opinion in PCT/JP2021/047555, mailed Mar. 22, 2022, 4 pages.

* cited by examiner

FILTER DEVICE, RADIO-FREQUENCY MODULE, AND COMMUNICATION DEVICE

CROSS REFERENCE TO RELATED APPLICATIONS

This application claims the benefit of priority to Japanese Patent Application No. 2020-219306 filed on Dec. 28, 2020 and is a Continuation Applications of PCT Application No. PCT/JP2021/047555 filed on Dec. 22, 2021. The entire contents of each application are hereby incorporated herein by reference.

BACKGROUND OF THE INVENTION

1. Field of the Invention

The present invention relates to filter devices, radio-frequency modules, and communication devices. In particular, the present invention relates to a filter device including a ladder circuit including series arm resonators and parallel arm resonators, a radio-frequency module including the filter device, and a communication device including the radio-frequency module.

2. Description of the Related Art

The acoustic wave filter device described in International Publication No. 2014/050219 includes a ladder circuit and at least one inductor. The ladder circuit includes multiple series arm resonators and multiple parallel arm resonators. The at least one inductor is coupled with the series arm resonators and the parallel arm resonators. The at least one inductor contributes to filter bandwidth expansion.

In the acoustic wave filter device (wide-band acoustic wave filter device) described in International Publication No. 2014/050219, the parallel arm resonators and the series arm resonators share a piezoelectric substrate. This makes it difficult to suppress degradation of filter characteristics.

SUMMARY OF THE INVENTION

Preferred embodiments of the present invention provide filter devices, radio-frequency modules, and communication devices that each provide a wide pass band while reducing or preventing degradation of filter characteristics.

A filter device according to a preferred embodiment of the present invention includes a substrate and a ladder filter at the substrate. The ladder filter includes a plurality of acoustic wave resonators and at least one inductor. The plurality of acoustic wave resonators include a series arm resonator and a parallel arm resonator. The at least one inductor is coupled to the plurality of acoustic wave resonators. A pass bandwidth of the ladder filter is larger than a resonance bandwidth of at least one acoustic wave resonator of the plurality of acoustic wave resonators. The series arm resonator includes a first piezoelectric substrate. The parallel arm resonator includes a second piezoelectric substrate different from the first piezoelectric substrate.

A radio-frequency module according to a preferred embodiment of the present invention includes a filter device according to a preferred embodiment of the present invention and a mounting board. The mounting board includes the filter device.

A communication device according to a preferred embodiment of the present invention includes a radio-frequency module according to a preferred embodiment of the present invention and a signal processing circuit. The signal processing circuit is coupled to the radio-frequency module. The signal processing circuit is operable to process a radio-frequency signal.

Preferred embodiments of the present invention each easily achieve a wide bandwidth with desired filter characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
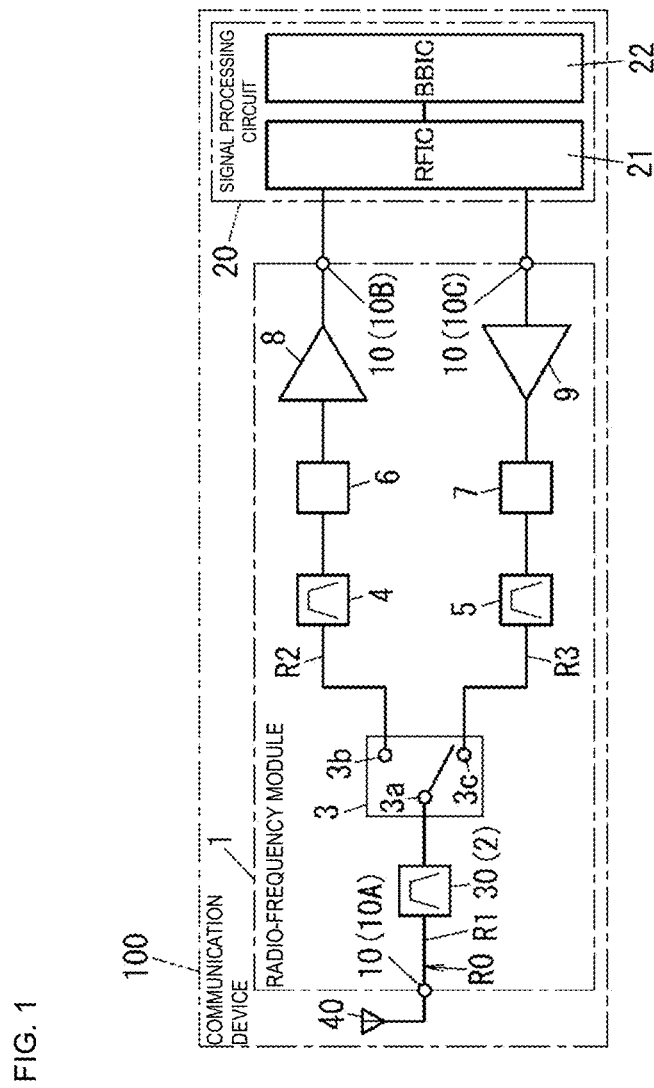
FIG. 1 is a block diagram of a radio-frequency module and a communication device according to a first preferred embodiment of the present invention.

FIGS. 1 to 14, which are referred to in the following preferred embodiments and modifications, are all schematic drawings, and the proportion of size and thickness of each element in the drawings is not necessarily the same as the corresponding proportion in actual measurements.

First Preferred Embodiment (1) Outline

Figure 2:
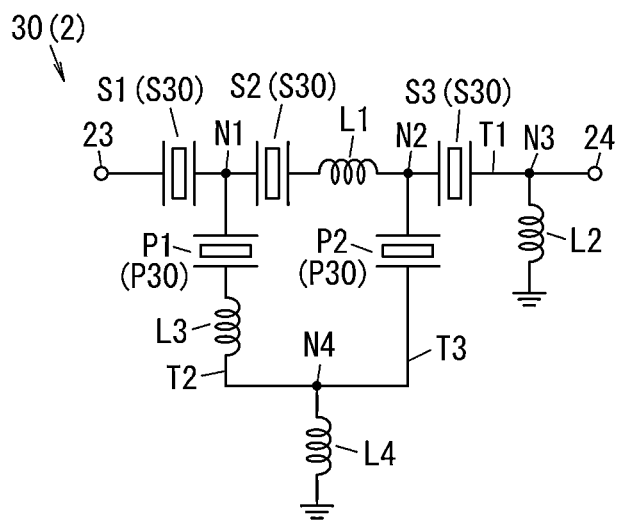
FIG. 2 is a circuit diagram illustrating an example of a circuit configuration of a filter device according to the first preferred embodiment of the present invention.
Figure 3:
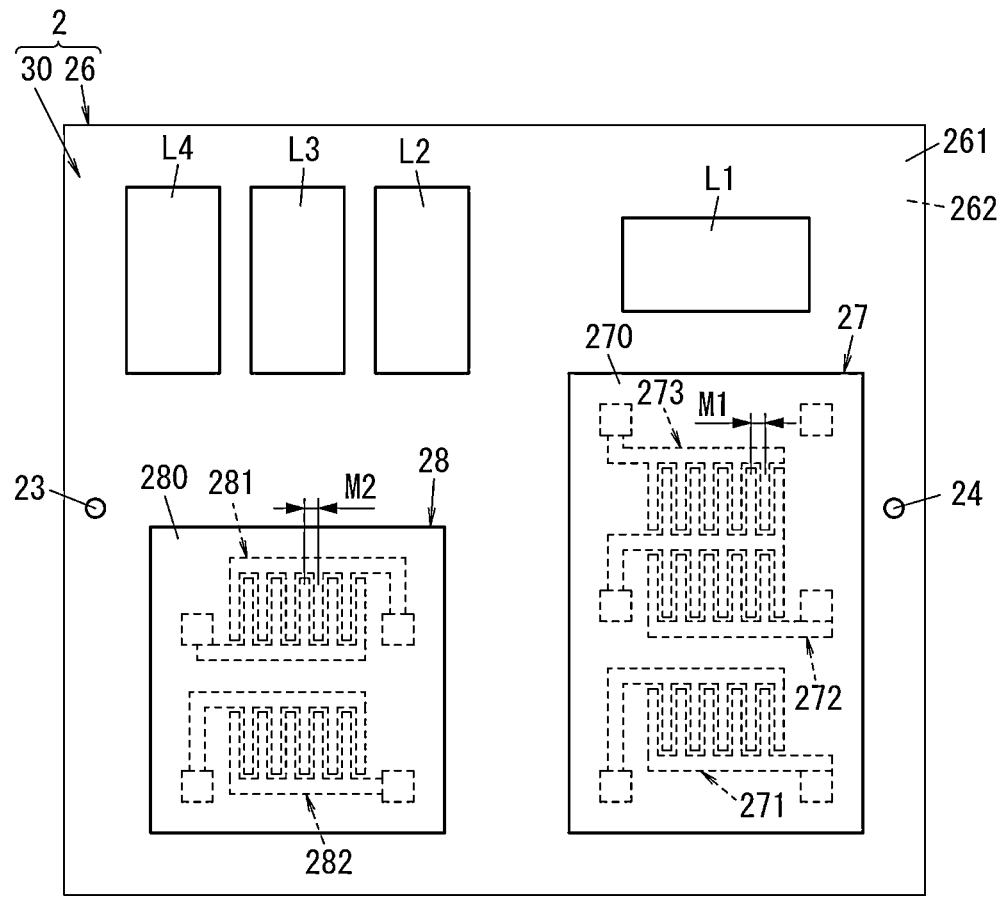
FIG. 3 is a plan view illustrating an example of a separated configuration of piezoelectric substrates of the filter device according to the first preferred embodiment of the present invention.
Figure 4:
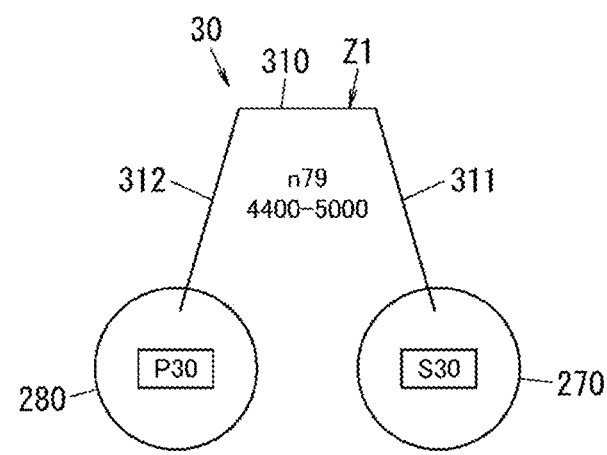
FIG. 4 shows the separated configuration of piezoelectric substrates of the filter device according to the first preferred embodiment of the present invention.

A filter device 2 according to a first preferred embodiment of the present invention includes, as illustrated in FIGS. 2 to 4, a filter substrate 26 (a substrate) (see FIG. 3) and a filter 30. The filter 30 is provided at the filter substrate 26. The filter 30 includes acoustic wave resonators S1 to S3, and P1 and P2 and inductors L1 to L4 as at least one inductor. The acoustic wave resonators S1 to S3, and P1 and P2 include series arm resonators S1 to S3 and parallel arm resonators P1 and P2 that define a ladder circuit. The inductors L1 to L4 as at least one inductor are coupled to the acoustic wave resonators S1 to S3, and P1 and P2. The pass bandwidth of the filter 30 is larger than the band width of at least one of the acoustic wave resonators S1 to S3, and P1 and P2. The series arm resonators S1 to S3 include a piezoelectric substrate 270 (a first piezoelectric substrate). The parallel arm resonators P1 and P2 include a piezoelectric substrate 280 (a second piezoelectric substrate) that is different from the piezoelectric substrate 270.

In this configuration, the series arm resonators S1 to S3 and the parallel arm resonators P1 and P2 of the filter 30 respectively include the different piezoelectric substrates 270 and 280. As a result, it is possible to provide a wide pass band while reducing or preventing degradation of filter characteristics.

(2) Description of Details

The following describes details of a filter device, a radio-frequency module, and a communication device according to the first preferred embodiment with reference to FIGS. 1 to 4.

(2-1) Configuration of Communication Device

As illustrated in FIG. 1, a communication device 100 includes a radio-frequency module 1. The communication device 100 may be, for example, a mobile terminal (for example, a smartphone). The communication device 100 is not limited to this example and may be a wearable device (for example, a smartwatch). The radio-frequency module 1 can support, for example, the fourth generation (4G) and fifth generation (5G) technology standards for cellular networks. Examples of the 4G standards include the 3rd Generation Partnership Project (3GPP) Long-Term Evolution (LTE) standard. Examples of the 5G standards include 5G New Radio (NR). The radio-frequency module 1 enables carrier aggregation and dual connectivity.

The communication device 100 includes, in addition to the radio-frequency module 1, a signal processing circuit 20 and an antenna 40 as one or more antennas (one antenna in the example in the drawing).

The radio-frequency module 1 is configured to amplify a receive signal (a radio-frequency signal) received by the antenna 40 and output the receive signal to the signal processing circuit 20. The radio-frequency module 1 is also configured to amplify a transmit signal from the signal processing circuit 20 and output the transmit signal to the antenna 40. The radio-frequency module 1 is controlled by, for example, the signal processing circuit 20.

The signal processing circuit 20 is coupled to the radio-frequency module 1. The signal processing circuit 20 is configured to process a receive signal received from the radio-frequency module 1. The signal processing circuit 20 is also configured to process a transmit signal to be outputted to the radio-frequency module 1. The signal processing circuit 20 includes a radio-frequency (RF) signal processing circuit 21 and a baseband signal processing circuit 22.

The RF signal processing circuit 21, which is, for example, a radio frequency integrated circuit (RFIC), processes a radio-frequency signal (a receive signal). The RF signal processing circuit 21 processes by, for example, down-conversion a receive signal received from the radio-frequency module 1 and outputs the receive signal to the baseband signal processing circuit 22. The RF signal processing circuit 21 also processes by, for example, up-conversion a transmit signal outputted from the baseband signal processing circuit 22 and outputs the transmit signal to the radio-frequency module 1.

The baseband signal processing circuit 22 is, for example, a baseband integrated circuit (BBIC). The baseband signal processing circuit 22 outputs a receive signal received from the RF signal processing circuit 21 to the outside. This output signal (a receive signal) is usable as, for example, an image signal for image display or a sound signal for calls. The baseband signal processing circuit 22 generates a transmit signal from a baseband signal (for example, sound signal and image signal) inputted from the outside and outputs the generated transmit signal to the RF signal processing circuit 21.

(2-2) Circuit Configuration of Radio-Frequency Module

The radio-frequency module 1 of the present preferred embodiment is a radio-frequency module including the filter device 2 having a wide pass band (for example, a fractional bandwidth of about 7% or more). The wide pass band corresponds to, for example, 5G sub-6G bands (for example, Bands n77 and n79) and 4G Band 41. The "fractional bandwidth" indicates the pass bandwidth divided by the center frequency. The following describes an example of the radio-frequency module 1 of this kind with reference to FIG. 1.

As illustrated in FIG. 1, the radio-frequency module 1 transfers radio-frequency signals (for example, receive signals and transmit signals) between the signal processing circuit 20 and the antenna 40. The radio-frequency module 1 includes as electronic components, for example, the filter device 2, a switch 3, a receive filter 4, a transmit filter 5, matching circuits 6 and 7, a low-noise amplifier 8, and a power amplifier 9. The radio-frequency module 1 also includes external connection terminals 10 as multiple external connection terminals (for example, three external connection terminals). The radio-frequency module 1 also includes signal paths R1 to R3 as multiple signal paths (for example, three signal path). The radio-frequency module 1 also includes a mounting board at which the electronic components and the external connection terminals 10 are provided. The mounting board includes a first major surface and a second major surface that are opposed to each other. The electronic components and the external connection terminals 10 are provided at the first major surface or the second major surface of the mounting board.

(2-2-1) External Connection Terminal

The external connection terminals 10 include an antenna terminal 10A, a signal output terminal 10B, and a signal input terminal 10C. The antenna terminal 10A is coupled to the antenna 40. The signal output terminal 10B is a terminal to output a receive signal processed by the radio-frequency module 1 to the signal processing circuit 20. The signal output terminal 10B is coupled to an input of the signal processing circuit 20. The signal input terminal 10C is a terminal to input a transmit signal from the signal processing circuit 20. The signal input terminal 10C is coupled to an output of the signal processing circuit 20.

(2-2-2) Signal Path

The signal paths R1 to R3 define a signal path R0 connecting the external connection terminals 10 to input or output a signal (a receive signal or transmit signal). In other words, the signal paths R1 to R3 define the signal path R0. The signal path R0 is a signal path for a signal transferred or to be transferred through the antenna terminal 10A. The signal path R1 connects the antenna terminal 10A and a common terminal 3a of the switch 3. The filter 30 is provided in the signal path R1. The signal path R2 connects a selection terminal 3b of the switch 3 and the signal output terminal 10B. The receive filter 4, the matching circuit 6, and the low-noise amplifier 8 are provided in the signal path R2. The signal path R3 connects a selection terminal 3c of the switch 3 and the signal input terminal 10C. The transmit filter 5, the matching circuit 7, and the power amplifier 9 are provided in the signal path R3.

(2-2-3) Switch

The switch 3 selects between the signal paths R2 and R3 a signal path corresponding to a communication band to be used for reception of receive signals or transmission of transmit signals and connects the selected signal path to the signal path R1 leading to the antenna terminal 10A. The switch 3 is, for example, a switch integrated circuit (IC). The switch 3 includes the common terminal 3a as one or more common terminals (for example, one common terminal) and the selection terminals 3b and 3c as one or more selection terminals (two selection terminals in the example in the drawing). The common terminal 3a is coupled to an input/output of the filter 30 via the signal path R1. The selection terminal 3b is coupled to an input of the receive filter 4 via the signal path R2. The selection terminal 3c is coupled to an output of the transmit filter 5 via the signal path R3. The switch 3 selectively connects the selection terminal 3b or 3c with the common terminal 3a. In other words, the switch 3 selects one or more selection terminals (for example, one selection terminal) from the selection terminals 3b and 3c and establishes connection (establishes communication) between the selected selection terminal and the common terminal 3a.

(2-2-4) Filter Device

The filter device 2 includes the filter 30 having a wide bandwidth with a filter fractional bandwidth of, for example, about 7% or more. The pass band of the filter 30 (a first pass band) is, for example, about 3 GHz or higher. The pass band of the filter 30 allows signals in a first communication band (for example, n79) to pass. The filter 30 is provided in the signal path R1. The filter 30 is a transmit-receive filter to pass signals flowing along the signal path R1 (that is, the signal path R0).

The filter 30 includes a first input-output terminal and a second input-output terminal. The first input-output terminal of the filter 30 is coupled to the antenna terminal 10A. The second input-output terminal of the filter 30 is coupled to the common terminal 3a of the switch 3. The filter 30 limits receive signals inputted to the first input-output terminal to signals in the pass band described above and outputs the signals from the second input-output terminal. The filter 30 also limits transmit signals inputted to the second input-output terminal to signals in the pass band described above and outputs the signals from the first input-output terminal.

The filter 30 is an acoustic wave filter. The acoustic wave filter is, for example, a surface acoustic wave (SAW) filter using surface acoustic waves. The filter 30 includes multiple acoustic wave resonators. The acoustic wave resonator includes a piezoelectric substrate and an interdigital transducer (IDT) electrode (a comb-shaped electrode) on the piezoelectric substrate. The acoustic wave resonators include series arm resonators and parallel arm resonators that define a ladder circuit. The filter 30 includes at least one inductor coupled to the acoustic wave resonators. The pass bandwidth of the filter 30 is larger than the band width of at least one of the acoustic wave resonators. The receive filter 4 and the transmit filter 5 are not limited to SAW filters, and instead of SAW filters, the receive filter 4 and the transmit filter 5 may be, for example, bulk acoustic wave (BAW) filters.

(2-2-5) Receive Filter and Transmit Filter

The receive filter 4 is provided in the signal path R2 and configured to pass signals flowing along the signal path R2 (that is, the signal path R0). The receive filter 4 has a pass band that allows signals in a second communication band to pass. The transmit filter 5 is provided in the signal path R3 and configured to pass signals flowing along the signal path R3 (that is, the signal path R0). The transmit filter 5 has a pass band that allows signals in a third communication band to pass. The pass band of the receive filter 4 coincides with the pass band of the transmit filter 5. The pass band of the receive filter 4 and the pass band of the transmit filter 5 coincide with a portion of the pass band of the filter 30. This means that the frequency band of the second communication band and the frequency band of the third communication band coincide with a portion of the frequency band of the first communication band.

The receive filter 4 includes an input terminal and an output terminal. The input terminal of the receive filter 4 is coupled to the selection terminal 3b of the switch. The output terminal of the receive filter 4 is coupled to the matching circuit 6. The receive filter 4 limits receive signals inputted to the input terminal to signals in the pass band described above and outputs the signals from the output terminal. The transmit filter 5 includes an input terminal and an output terminal. The input terminal of the transmit filter 5 is coupled to the matching circuit 7. The output terminal of the transmit filter 5 is coupled to the selection terminal 3c of the switch 3. The transmit filter 5 limits transmit signals inputted to the input terminal of the transmit filter 5 to signals in the pass band described above and outputs the signals from the output terminal of the transmit filter 5.

The receive filter 4 and the transmit filter 5 may both be acoustic wave filters. The acoustic wave filters are, for example, SAW filters using surface acoustic waves. The receive filter 4 and the transmit filter 5 each include multiple acoustic wave resonators. The acoustic wave resonator includes a piezoelectric substrate and an IDT electrode (a comb-shaped electrode) on the piezoelectric substrate. The acoustic wave resonators include series arm resonators and parallel arm resonators that define a ladder circuit. The receive filter 4 and the transmit filter 5 are not limited to SAW filters, and instead of SAW filters, the receive filter 4 and the transmit filter 5 may be, for example, BAW filters.

(2-2-6) Low-Noise Amplifier and Power Amplifier

The low-noise amplifier 8 is provided in the signal path R2. The low-noise amplifier 8 includes an input and an output. The input is coupled to the matching circuit 6. The output is coupled to the signal output terminal 10B. The low-noise amplifier 8 amplifies a receive signal inputted to the input and outputs the receive signal from the output. The power amplifier 9 is provided in the signal path R3. The power amplifier 9 includes an input and an output. The input is coupled to the signal input terminal 10C. The output is coupled to the matching circuit 7. The power amplifier 9 amplifies a transmit signal inputted to the input and outputs the transmit signal from the output.

(2-2-7) Matching Circuit

The matching circuit 6 is provided in the signal path R2. The matching circuit 6 provides impedance matching between the receive filter 4 and the low-noise amplifier 8. The matching circuit 6 is coupled between the receive filter 4 and the low-noise amplifier 8. The matching circuit 7 is provided in the signal path R3. The matching circuit 7 provides impedance matching between the transmit filter 5 and the power amplifier 9. The matching circuit 7 is coupled between the transmit filter 5 and the power amplifier 9.

(2-3) Operations of Communication Device

The following describes operations of the communication device 100 with reference to FIG. 1.

During a receive operation, the common terminal 3a of the switch 3 is coupled to the selection terminal 3b. As a result, the signal path R1 and the signal path R2 are coupled to each other. In this state, when the antenna 40 receives a receive signal, the receive signal flows along the signal paths R1 and R2. At this time, the receive signal passes through the filter 30, the receive filter 4, the matching circuit 6, and the low-noise amplifier 8 in the order presented. The receive signal is consequently outputted from the signal output terminal 10B to the signal processing circuit 20.

During a transmit operation, the common terminal 3a of the switch 3 is coupled to the selection terminal 3c. As a result, the signal path R1 and the signal path R3 are coupled to each other. In this state, when a transmit signal is inputted from the signal processing circuit 20 to the signal input terminal 10C, the transmit signal flows along the signal paths R3 and R1. At this time, the transmit signal passes through the power amplifier 9, the matching circuit 7, the transmit filter 5, and the filter 30 in the order presented. The transmit signal is consequently outputted from the antenna terminal 10A and transmitted by the antenna 40.

(2-4) Circuit Configuration of Filter Device

The following describes an example of a circuit configuration of the filter device 2 with reference to FIG. 2. As illustrated in FIG. 2, the filter device 2 includes the filter 30. The filter 30 includes a first input-output terminal 23, a second input-output terminal 24, the acoustic wave resonators S1 to S3, and P1 and P2 as multiple acoustic wave resonators (for example, five acoustic wave resonators), and the inductors L1 to L4 as at least one inductor (for example, four inductors).

The first input-output terminal 23 is coupled to the antenna terminal 10A. The second input-output terminal 24 is coupled to the common terminal 3a of the switch 3.

The acoustic wave resonators S1 to S3, and P1 and P2 include series arm resonators S1 to S3 and parallel arm resonators P1 and P2 that define a ladder circuit between the first input-output terminal 23 and the second input-output terminal 24. In the following, when necessary, the series arm resonators S1 to S3 of the filter 30 are also collectively referred to as the series arm resonators S30, and the parallel arm resonators P1 and P2 of the filter 30 are also collectively referred to as the parallel arm resonators P30.

The series arm resonators S1 to S3 are coupled in series with each other in a signal path (also referred to as a series arm) T1 between the first input-output terminal 23 and the second input-output terminal 24. The parallel arm resonators P1 and P2 are provided in signal paths (also referred to as parallel arms) T2 and T3 between nodes N1 and N2 in the signal path T1 and the ground. The node N1 is located between the adjacent series arm resonators S1 and S2. The node N2 is located between the adjacent series arm resonators S2 and S3. The signal path T2 connects the node N1 to the ground. The signal path T3 connects the node N2 to a node N4 of the signal path T2.

The series arm resonators S1 to S3 and the parallel arm resonators P1 and P2 provide the pass band of the filter 30 (in Band n79, for example, a frequency band of about 4400 MHz to about 5000 MHz). The series arm resonators S1 to S3 provide an attenuation band with instantaneous transition from the band on the higher frequency side (in Band n79, for example, near 5000 MHz) with respect to the filter 30. The parallel arm resonators P1 and P2 provide an attenuation band with instantaneous transition from the band on the lower frequency side (in Band n79, for example, near 4400 MHz) with respect to the filter 30.

The four inductors L1 to L4 are coupled to the acoustic wave resonators S1 to S3, and P1 and P2. Specifically, the inductors L1 and L2 are coupled to the series arm resonators S2 and S3. More specifically, the inductor L1 is coupled between the adjacent series arm resonators S2 and S3 (to be specific, between the series arm resonator S2 and the node N2). The inductor L2 is coupled between a node N3 in the signal path T1 and the ground. The inductors L1 and L2 coupled to the series arm resonators S2 and S3 contribute to improvement of the pass band of the filter 30.

The inductors L3 and L4 are coupled to the parallel arm resonators P1 and P2. Specifically, the inductors L3 and L4 are coupled in series with each other between the parallel arm resonator P1 in the signal path T2 and the ground. The node N4 connected with the signal path T3 is located between the inductors L3 and L4 in the signal path T2. The inductors L3 and L4 coupled to the parallel arm resonators P1 and P2 contribute to enhancement of the pass band of the filter 30.

(2-5) Separated Configuration of Filter Piezoelectric Substrates

The pass band of the filter 30 is, for example, Band n79 (about 4400 MHz-about 5000 MHz). The anti-resonant frequency of the series arm resonators S1 to S3 defines the attenuation band on the higher frequency side (near 5000 MHz) with respect to the filter 30. The resonant frequency of the parallel arm resonators P1 and P2 defines the attenuation band on the lower frequency side (near 4400 MHz) with respect to the filter 30.

In the wide-band filter 30, when the pass band is made wider, the difference between the anti-resonant frequency of the series arm resonators S1 to S3 and the resonant frequency of the parallel arm resonators P1 and P2 becomes relatively large. For example, in Band n79, the difference can be about 600 MHz. This means that when the acoustic wave resonators S1 to S3, and P1 and P2 are defined by IDT electrodes, the electrode pitch of the IDT electrodes of the series arm resonators S1 to S3 significantly differs from the electrode pitch of the IDT electrodes of the parallel arm resonators P1 and P2.

In this case, if the IDT electrodes of the series arm resonators S1 to S3 and the IDT electrodes of the parallel arm resonators P1 and P2 are provided on the same piezoelectric substrate, it is difficult to make the series arm resonators S1 to S3 and the parallel arm resonators P1 and P2 with desired electrode pitches of IDT electrodes. This means that it is difficult to achieve desired filter characteristics of the filter 30. As a result, filter characteristics of the filter 30 may be degraded.

In this respect, in the present preferred embodiment, as regards the wide-band filter 30, the piezoelectric substrate of the series arm resonators S1 to S3 and the parallel arm resonators P1 and P2 is divided into different piezoelectric substrates (a separated configuration of piezoelectric substrates). In this manner, the IDT electrodes of the series arm resonators S1 to S3 and the IDT electrodes of the parallel arm resonators P1 and P2 are provided using different piezoelectric substrates. The IDT electrodes of the series arm resonators S1 to S3 and the IDT electrodes of the parallel arm resonators P1 and P2 are thus provided in a separate manner. As a result, it is possible to easily make the IDT electrodes of the series arm resonators S1 to S3 and the IDT electrodes of the parallel arm resonators P1 and P2 with desired electrode pitches.

Specifically, as illustrated in FIG. 3, the filter device 2 includes the filter substrate 26, the filter 30, and the first input-output terminal 23 and the second input-output terminal 24. The filter 30 includes a series arm resonator chip 27 and a parallel arm resonator chip 28, and the inductors L1 to L4.

The filter substrate 26 is a substrate to arrange the electronic components defining the filter 30 (the series arm resonator chip 27, the parallel arm resonator chip 28 and the inductors L1 to L4). The filter substrate 26 is shaped as, for example, a rectangular or substantially rectangular plate. The filter substrate 26 includes a first major surface 261 and a second major surface 262 that are opposed to each other in the thickness direction of the filter substrate 26.

The electronic components, and the first input-output terminal 23 and the second input-output terminal 24 are disposed at the first major surface 261 or the second major surface 262 of the filter substrate 26. In the example in FIG. 3, the electronic components, and the first input-output terminal 23 and the second input-output terminal 24 are disposed at the first major surface 261 of the filter substrate 26.

In the present preferred embodiment, the term "dispose" includes the case in which an electronic component is provided at (mechanically coupled with) the first major surface 261 or the second major surface 262 of the filter substrate 26 and the case in which an electronic component is electrically coupled to (any conductor portion of) the filter substrate 26.

The series arm resonator chip 27 is a chip in which the series arm resonators S1 to S3 are provided using the shared piezoelectric substrate 270. The series arm resonator chip 27 includes the shared piezoelectric substrate 270 and IDT electrodes 271 to 273 of the respective series arm resonators S1 to S3. The shared piezoelectric substrate 270 includes two major surfaces, of the two major surfaces, the IDT electrodes 271 to 273 are disposed at a major surface on one side (for example, the filter substrate 26 side). The series arm resonators S1 to S3 include the piezoelectric substrate 270 and the respective IDT electrodes 271 to 273. As such, the series arm resonators S1 to S3 share the piezoelectric substrate 270.

The parallel arm resonator chip 28 is a chip in which the parallel arm resonators P1 and P2 are provided using the shared piezoelectric substrate 280. The parallel arm resonator chip 28 includes the shared piezoelectric substrate 280 and IDT electrodes 281 and 282 of the respective parallel arm resonators P1 and P2. The shared piezoelectric substrate 280 includes two major surfaces, of the two major surfaces, the IDT electrodes 281 and 282 are disposed at a major surface on one side (for example, the filter substrate 26 side). The parallel arm resonators P1 and P2 are defined by the piezoelectric substrate 280 and the respective IDT electrodes 281 and 282. As such, the parallel arm resonators P1 and P2 share the piezoelectric substrate 280.

The piezoelectric substrate 280 of the parallel arm resonators P1 and P2 is different from the piezoelectric substrate 270 of the series arm resonators S1 to S3. This means that the series arm resonators S1 to S3 include the piezoelectric substrate 270, whereas the parallel arm resonators P1 and P2 include the piezoelectric substrate 280 that is different from the piezoelectric substrate 270.

The series arm resonator chip 27 and the parallel arm resonator chip 28 are disposed at the filter substrate 26, for example, such that the IDT electrodes 271 to 273, and 281 and 282 face the filter substrate 26. The filter 30 is disposed at the mounting board of the radio-frequency module 1, for example, such that the first input-output terminal 23 and the second input-output terminal 24 disposed at the filter substrate 26 face the mounting board of the radio-frequency module 1.

As described above, the IDT electrodes 271 to 273 of the series arm resonators S1 to S3 and the IDT electrodes 281 and 282 of the parallel arm resonators P1 and P2 are respectively provided at the different piezoelectric substrates 270 and 280. With this configuration, it is possible to individually determine the electrode pitch of the IDT electrodes 271 to 273 and the electrode pitch of the IDT electrodes 281 and 282. The frequency of the series arm resonators S1 to S3 and the frequency of the parallel arm resonators P1 and P2 are thus individually adjustable. As a result, it is possible to easily achieve desired filter characteristics of the filter 30. Because the electrode pitch of the IDT electrodes 271 to 273 and the electrode pitch of the IDT electrodes 281 and 282 are individually determined, the IDT electrodes 271 to 273, and 281 and 282 are provided in a stable manner. As a result, it is possible to reduce variations in filter characteristics among individual products of the filter 30. It is thus possible to easily achieve desired filter characteristics. As such, degradation of filter characteristics is reduced or prevented.

(2-6) Schematic Diagram of Separated Configuration of Filter Piezoelectric Substrates FIG. 4 schematically illustrates the separated configuration of the piezoelectric substrates 270 and 280 of the filter 30 in the case in which the pass band of the filter 30 is, for example, Band n79 (about 4400 MHz-about 5000 MHz). When the pass band of the filter 30 is Band n79, the attenuation band on the higher frequency side (near 5000 MHz) with respect to the filter 30 is defined by the anti-resonant frequency of the series arm resonators of the filter 30. The attenuation band on the lower frequency side (near 4400 MHz) with respect to the filter 30 is defined by the resonant frequency of the parallel arm resonators of the filter 30.

In FIG. 4, an upper side 310 of a trapezoid Z1 represents the pass band of the filter 30 (in Band n79, for example, about 4400 MHz to about 5000 MHz). In the following, the pass band of the filter 30 is also referred to as the pass band 310. A sloping portion 311 on the right side of the trapezoid Z1 represents the attenuation band on the higher frequency side (near 5000 MHz) with respect to the filter 30 (hereinafter also referred to as the attenuation band 311). A sloping portion 312 on the left side of the trapezoid Z1 represents the attenuation band on the lower frequency side (near 4400 MHz) with respect to the filter 30 (hereinafter also referred to as the attenuation band 312).

In FIG. 4, "P30" is indicated under the attenuation band 312 on the lower frequency side with respect to the filter 30, "P30" means that the parallel arm resonators P30 of the filter 30 provide the attenuation band 312 on the lower frequency side with respect to the filter 30. Similarly, "S30" is indicated under the attenuation band 311 on the higher frequency side with respect to the filter 30, "S30" means that the series arm resonators S30 of the filter 30 provide the attenuation band 311 on the higher frequency side with respect to the filter 30. In FIG. 4, the representations of "S30" and "P30" are circled with separate rings (reference numerals 270 and 280). This indicates that the piezoelectric substrate 270 of the series arm resonators S30 and the piezoelectric substrate 280 of the parallel arm resonators P30 of the filter 30 are different piezoelectric substrates (in other words, the piezoelectric substrates 270 and 280 are separate).

(3) Main Advantageous Effects

As described above, the filter device 2 according to the first preferred embodiment includes the filter substrate 26 (a substrate) and the filter 30. The filter 30 is provided at the filter substrate 26. The filter 30 includes the acoustic wave resonators S1 to S3, and P1 and P2 and the inductors L1 to L4 as at least one inductor. The acoustic wave resonators S1 to S3, and P1 and P2 include the series arm resonators S1 to S3 and the parallel arm resonators P1 and P2 that define a ladder circuit. The inductors L1 to L4 as at least one inductor are coupled to the acoustic wave resonators S1 to S3, and P1 and P2. The pass bandwidth of the filter 30 is larger than the band width of at least one of the acoustic wave resonators S1 to S3, and P1 and P2. In other words, the series arm resonators S1 to S3 include the piezoelectric substrate 270 (a first piezoelectric substrate), and the parallel arm resonators P1 and P2 include the piezoelectric substrate 280 (a second piezoelectric substrate) that is different from the piezoelectric substrate 270.

In this configuration, the filter 30 is a ladder filter including the acoustic wave resonators S1 to S3, and P1 and P2 including the series arm resonators S1 to S3 and the parallel arm resonators P1 and P2. The filter 30 includes the inductors L1 to L4 as at least one inductor that are coupled to the acoustic wave resonators S1 to S3, and P1 and P2. The pass bandwidth of the filter 30 is larger than the resonance bandwidth of at least one of the acoustic wave resonators S1 to S3, and P1 and P2. As such, the filter 30 is structured as a wide-band filter. The series arm resonators S1 to S3 and the parallel arm resonators P1 and P2 of the filter 30 respectively include the different piezoelectric substrates 270 and 280. The frequency of the series arm resonators S1 to S3 and the parallel arm resonators P1 and P2 are thus individually adjustable. As a result, the filter 30 easily achieves desired filter characteristics. As such, degradation of filter characteristics of the filter 30 is reduced or prevented.

In known technologies, series arm resonators and parallel arm resonators share one piezoelectric substrate. As a result, it is difficult to configure the series arm resonators and parallel arm resonators in greatly different manners (for example, IDT electrode pitch) to produce a wide-band filter. In this respect, in the present preferred embodiment, the piezoelectric substrate 270 of the series arm resonators S1 to S3 (S30) and the piezoelectric substrate 280 of the parallel arm resonators P1 and P2 (P30) are separated. Thus, the series arm resonators S1 to S3 (S30) and the parallel arm resonators P1 and P2 (P30) can be configured in greatly different manners. As a result, as described above, it is possible to achieve a wide bandwidth while reducing or preventing degradation of filter characteristics.

(4) Modification

The following describes modifications of the first preferred embodiment of the present invention. In the following description, the same or corresponding elements as the first preferred embodiment are assigned the same reference numerals, and descriptions thereof are not repeated. The main focus in the following description is on points different from the first preferred embodiment.

(4-1) First Modification

Figure 5:
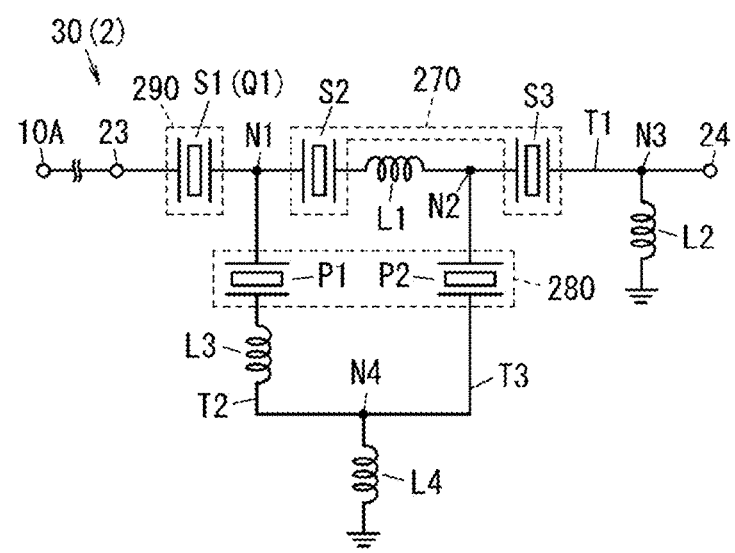
FIG. 5 is a circuit diagram of a filter device according to a first modification of the first preferred embodiment of the present invention.

As illustrated in FIG. 5, in the first modification, among the acoustic wave resonators S1 to S3, and P1 and P2 in the first preferred embodiment, an acoustic wave resonator at the shortest distance along the signal path from the antenna terminal 10A is referred to as a nearest acoustic wave resonator Q1. In this modification, the nearest acoustic wave resonator Q1 includes a piezoelectric substrate (for example, 290) that is different from the piezoelectric substrate 270 (the first piezoelectric substrate) and the piezoelectric substrate 280 (the second piezoelectric substrate). In the example in FIG. 5, the series arm resonator S1 is the nearest acoustic wave resonator Q1.

Because the nearest acoustic wave resonator Q1 is located at the shortest distance along the signal path from the antenna terminal 10A among the acoustic wave resonators S1 to S3, and P1 and P2, the nearest acoustic wave resonator Q1 affects antenna characteristics the most among the acoustic wave resonators S1 to S3, and P1 and P2. Thus, the piezoelectric substrate 290 of the nearest acoustic wave resonator Q1 and the piezoelectric substrates 270 and 280 of the other acoustic wave resonators are provided separately, so that the frequency of the nearest acoustic wave resonator Q1 and the other acoustic wave resonators are individually adjustable. This facilitates antenna characteristics control.

Figure 6:
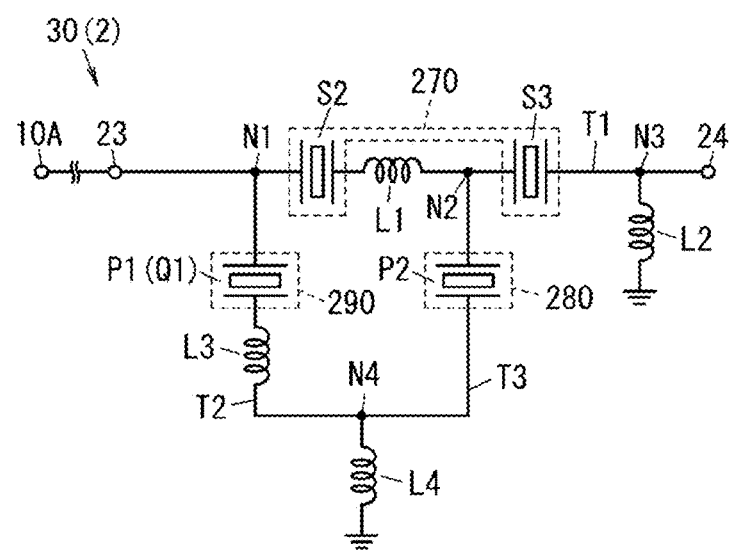
FIG. 6 is a circuit diagram of a filter device according to a modified example of the first modification.

As illustrated in FIG. 6, when the series arm resonator S1 is not provided in the first preferred embodiment, in other words, when both of the series arm resonator S2 and the parallel arm resonator P1 can be deemed as the nearest acoustic wave resonator Q1, the parallel arm resonator P1 may be designated as the nearest acoustic wave resonator Q1. In this case, the piezoelectric substrate of the parallel arm resonator P1 is provided separately from the piezoelectric substrates 270 and 280 of the other acoustic wave resonators. This means that the parallel arm resonator P1 includes the piezoelectric substrate 290 that is different from the piezoelectric substrate 270 of the series arm resonators S2 and S3 and the piezoelectric substrate 280 of the parallel arm resonator P2.

(4-2) Second Modification

Figure 7:
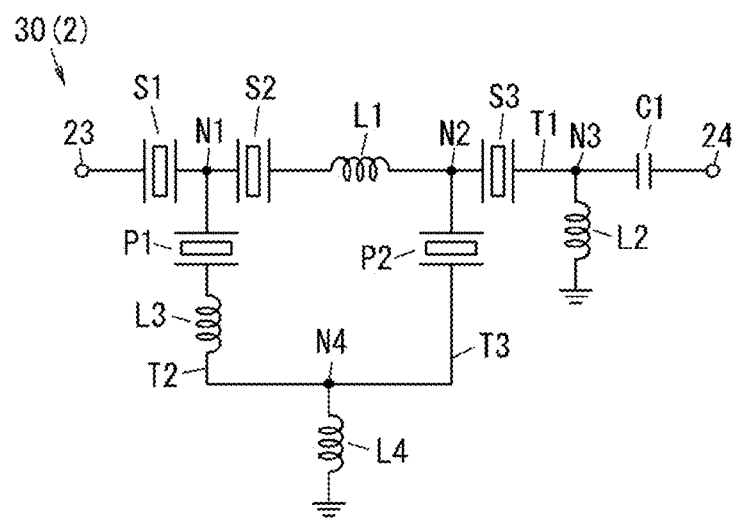
FIG. 7 is a circuit diagram of a filter device according to a second modification of the first preferred embodiment of the present invention.

The filter 30 of the first preferred embodiment provides a wide pass band with the inductors L1 to L4 as at least one inductor coupled to the acoustic wave resonators S1 to S3, and P1 and P2. The filter 30 of the second modification provides a wider pass band by, as illustrated in FIG. 7, additionally including a capacitor C1 that is coupled to one or more (for example, the inductor L1) of the inductors L1 to L4 as at least one inductor with respect to the first preferred embodiment. In the example in FIG. 7, the capacitor C1 is coupled to the inductor L2. Specifically, the inductor L2 is coupled between the node N3 in the signal path T1 and the ground. The node N3 is located between the series arm resonator S3 and the second input-output terminal 24. The capacitor C1 is coupled between the node N3 and the second input-output terminal 24 in the signal path T1. This means that the capacitor C1 and the inductor L1 define an LC circuit (for example, a high pass filter). In this modification, the capacitor C1 coupled to the inductor L2 further broadens the pass band of the filter 30.

The filter 30 of this modification is configured such that an LC circuit is included in a ladder circuit filter including multiple acoustic wave resonators and one or more inductors. LC circuits have a characteristic in which LC circuits provide wide pass bands but sometimes cannot provide sufficiently steep attenuation slopes defining the attenuation bands on both sides with respect to the pass band. In contrast, ladder circuit filters have a characteristic in which ladder circuit filters do not necessarily provide wide pass bands but provide steep attenuation slopes at both sides of the pass band. Because the filter 30 of this modification includes both of the ladder circuit and the LC circuit described above, the filter 30 of this modification has both of the characteristic of ladder circuits and the characteristic of LC circuits. This means that the filter 30 of this modification has a characteristic in which the filter 30 of this modification provides a wide pass band and attenuation areas with steep attenuation slopes at both sides of the pass band. With this configuration, the filter 30 of this modification provides a wider bandwidth.

However, in the wide-band filter 30, as described in the first preferred embodiment, the difference between the anti-resonant frequency of the series arm resonators S1 to S3 and the resonant frequency of the parallel arm resonators P1 and P2 is large. If the piezoelectric substrate of the series arm resonators S1 to S3 and the piezoelectric substrate of the parallel arm resonators P1 and P2 include a shared piezoelectric substrate, the series arm resonators S1 to S3 and the frequency of the parallel arm resonators P1 and P2 cannot be individually adjusted. This degrades filter characteristics. In the filter 30 of this modification, as in the first preferred embodiment, the piezoelectric substrate of the series arm resonators S1 to S3 is different from the piezoelectric substrate of the parallel arm resonators P1 and P2, and thus, the frequency of the series arm resonators S1 to S3 and the parallel arm resonators P1 and P2 are individually adjustable. As such, the degradation of filter characteristics is reduced or prevented.

As described above, the filter 30 of this modification accomplishes bandwidth expansion with a ladder circuit and an LC circuit. As the bandwidth expands, the advantageous effects of reducing or preventing degradation of filter characteristics by separating the piezoelectric substrate of the series arm resonators S1 to S3 and the piezoelectric substrate of the parallel arm resonators P1 and P2 are improved. This means that the larger the bandwidth is, the more advantageous the configuration of the filter 30 of this modification is.

In this modification, the capacitor C1 defines a high pass filter in combination with the inductor L2. Instead, the capacitor C1 may define a low pass filter or band pass filter in combination with any of the inductors L1 to L4.

The circuit configuration of the filter 30 in FIG. 7 includes the capacitor C1 coupled to the acoustic wave resonators S1 to S3, and P1 and P2 that are the series arm resonators S1 to S3 and the parallel arm resonators P1 and P2 defining a ladder circuit. This configuration is an example of a filter that provides a wide pass band. Thus, the number of acoustic wave resonators in the filter 30 and the number of inductors in the filter 30 are not limited to the numbers indicated in the example in FIG. 7.

(4-3) Third Modification

In the first preferred embodiment, the piezoelectric substrate 270 of the series arm resonators S1 to S3 and the piezoelectric substrate 280 of the parallel arm resonators P1 and P2 are separate. By making use of this configuration, an electrode pitch M1 of the IDT electrodes 271 to 273 of the series arm resonators S1 to S3 may be made narrower than an electrode pitch M2 of the IDT electrodes 281 and 282 of the parallel arm resonators P and P2 (see FIG. 3). As a result, the anti-resonant frequency of the series arm resonators S1 to S3 is made higher than the resonant frequency of the parallel arm resonators P1 and P2.

(4-4) Fourth Modification

In the first preferred embodiment, the piezoelectric substrate 270 of the series arm resonators S1 to S3 and the piezoelectric substrate 280 of the parallel arm resonators P1 and P2 are separate. By making use of this configuration, the piezoelectric substrate 270 of the series arm resonators S1 to S3 and the piezoelectric substrate 280 of the parallel arm resonators P1 and P2 may be formed in different manners as regards cut-angles. As a result, the parallel arm resonators P1 and P2 and the series arm resonators S1 to S3 are formed with different optimum cut-angles to provide the attenuation bands 311 and 312 of the filter 30. This enhances filter characteristics of the filter 30.

(4-5) Fifth Modification

In the first preferred embodiment, the piezoelectric substrate 270 of the series arm resonators S1 to S3 and the piezoelectric substrate 280 of the parallel arm resonators P1 and P2 are separate. By making use of this configuration, the piezoelectric substrate 270 of the series arm resonators S1 to S3 and the piezoelectric substrate 280 of the parallel arm resonators P1 and P2 may be formed in different manners as regards thickness. As a result, the parallel arm resonators P1 and P2 and the series arm resonators S1 to S3 are formed with different optimum thicknesses (the thickness of the piezoelectric substrate 270 and the thickness of the piezoelectric substrate 280) to provide the attenuation bands 311 and 312 of the filter 30. This improves filter characteristics of the filter 30.

Second Preferred Embodiment

The following describes a filter device 50 according to a second preferred embodiment or the present invention with reference to FIGS. 8 to 11. In the following description, the same or corresponding elements as the first preferred embodiment are assigned the same reference numerals, and descriptions thereof are not repeated. The main focus in the following description is on points different from the first preferred embodiment.

(1) Outline

Figure 8:
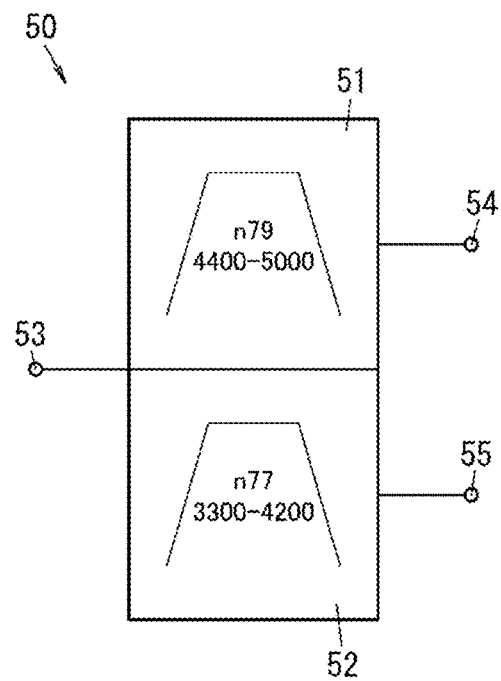
FIG. 8 is a schematic diagram of a configuration of a filter device according to a second preferred embodiment of the present invention.

The filter device 50 of the second preferred embodiment is a diplexer including two wide-band band-pass filters (a filter 51 (a first filter) and a filter 52 (a second filter)) (see FIG. 8). In the filter device 50, the filter 30 of the first preferred embodiment is used as the filter 51. An attenuation band 512 on the lower frequency side with respect to the filter 51 and an attenuation band 521 on the higher frequency side with respect to the filter 52 are continuously adjacent to each other. In this configuration, parallel arm resonators P51 of the filter 51 and series arm resonators S52 of the filter 52 share a piezoelectric substrate (see FIG. 9).

Specifically, in the filter 51, similarly to the filter 30 of the first preferred embodiment, the series arm resonators S51 and the parallel arm resonators P51 separately include different piezoelectric substrates. In the present preferred embodiment, of the parallel arm resonators P52 and the series arm resonators S52 of the filter 52, resonators (the series arm resonators S52) having a resonant frequency close to the resonant frequency of the parallel arm resonators P51 of the filter 51, and the parallel arm resonators P51 of the filter 51 are provided at a shared piezoelectric substrate. This means that the parallel arm resonators P51 of the filter 51 and the series arm resonators S52 of the filter 52 share a piezoelectric substrate. The following describes the filter device 50 in detail.

(2) Description of Details

As illustrated in FIG. 8, the filter device 50 includes the two filters 51 and 52, three input-output terminals 53 to 55, and a filter substrate. The two filters 51 and 52 and the three input-output terminals 53 to 55 are disposed at the filter substrate.

The input-output terminals 53 to 55 are terminals to input or output signals (transmit signals or receive signals) to or from the filter device 50. The input-output terminal 53 is coupled to the filters 51 and 52 in a shared manner. The input-output terminals 54 and 55 are respectively coupled to the filters 51 and 52.

The filters 51 and 52 are wide-band band-pass filters having, for example, a fractional bandwidth of about 7% or more and a pass band of about 3 GHz or higher. The filter 51 has a pass band that allows signals in a first frequency band (for example, Band n79 (about 4400 MHz-about 5000 MHz)) to pass. The filter 52 has a pass band that allows signals in a second frequency band (for example, Band n77 (about 3300 MHz-about 4200 MHz)) to pass. The second frequency band is lower than the first frequency band. The first frequency band and the second frequency band are continuously adjacent to each other.

The expression "the first frequency band and the second frequency band are continuously adjacent to each other" means that no other frequency band exists between the first frequency band and the second frequency band.

The filter 51 limits signals inputted to the input-output terminal 53 to the pass band and outputs the signals from the input-output terminal 54. The filter 51 also limits signals inputted to the input-output terminal 54 to the pass band and outputs the signals from the input-output terminal 53. The filter 52 limits signals inputted to the input-output terminal 53 to the pass band and outputs the signals from the input-output terminal 55. The filter 52 also limits signals inputted to the input-output terminal 55 to the pass band and outputs the signals from the input-output terminal 53.

Figure 9:
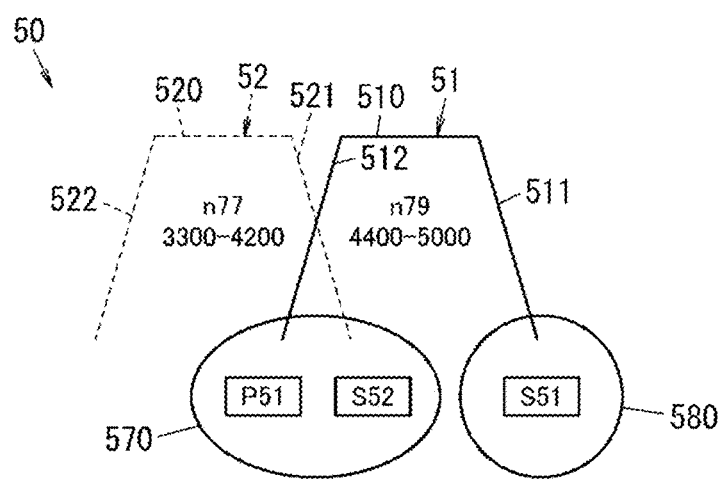
FIG. 9 shows a separated configuration of piezoelectric substrates of the filter device according to the second preferred embodiment of the present invention.

As illustrated in FIG. 9, the filter 51 has a pass band 510, and an attenuation band 511 and the attenuation band 512. The pass band 510 is a frequency band that allows signals in a first frequency band (for example, Band n79) to pass. The attenuation band 511 is a frequency band with a steep attenuation slope on the higher frequency side with respect to the pass band 510. The attenuation band 512 is a frequency band with a steep attenuation slope on the lower frequency side with respect to the pass band 510. The filter 51 includes multiple acoustic wave resonators including the series arm resonators S51 and the parallel arm resonators P51 that define a ladder circuit. The series arm resonators S51 of the filter 51 provides the attenuation band 511 on the higher frequency side with respect to the filter 51. The parallel arm resonators P51 of the filter 51 provides the attenuation band 512 on the lower frequency side with respect to the filter 51.

The filter 52 has a pass band 520, and the attenuation band 521 and an attenuation band 522. The pass band 520 is a frequency band that allows signals in the second frequency band (for example, Band n77) to pass. The attenuation band 521 is a frequency band with a steep attenuation slope on the higher frequency side with respect to the pass band 520. The attenuation band 522 is a frequency band with a steep attenuation slope on the lower frequency side with respect to the pass band 520. The filter 52 includes multiple acoustic wave resonators including the series arm resonators S52. The series arm resonators S52 of the filter 52 provides the attenuation band 521 on the higher frequency side with respect to the filter 52.

The pass band 510 of the filter 51 is a frequency band higher than the pass band 520 of the filter 52. This means that the lower limiting frequency of the pass band 510 is higher than the upper limiting frequency of the pass band 520. The attenuation band 512 on the lower frequency side with respect to the filter 51 and the attenuation band 521 on the higher frequency side with respect to the filter 52 are continuously adjacent to each other.

The expression "the pass band 510 and the pass band 520 are continuously adjacent to each other" means that no other pass band exists between the pass bands 510 and 520. The expression "the pass band 510 and the pass band 520 are continuously adjacent to each other" includes the following cases: the attenuation band 512 on the pass band 520 side, the lower frequency side) with respect to the filter 51 overlaps the attenuation band 521 on the pass band 510 side, the higher frequency side) with respect to the filter 52; and the attenuation band 512 of the filter 51 does not overlap the attenuation band 521 of the filter 52. FIG. 9 illustrates the case in which the attenuation band 512 of the filter 51 overlaps the attenuation band 521 of the filter 52.

Because the attenuation band 512 on the lower frequency side with respect to the filter 51 and the attenuation band 521 on the higher frequency side with respect to the filter 52 are continuously adjacent to each other, the resonant frequency of the parallel arm resonators P51 of the filter 51 is close to the anti-resonant frequency of the series arm resonators S52 of the filter 52. For this reason, in the present preferred embodiment, the parallel arm resonators P51 of the filter 51 and the series arm resonators S52 of the filter 52 are structured using a shared piezoelectric substrate, similarly to the first preferred embodiment. In other words, the parallel arm resonators P51 of the filter 51 and the series arm resonators S52 of the filter 52 share a piezoelectric substrate. In FIG. 9, a ring (reference numeral 570) drawn around both of the parallel arm resonators P51 and the series arm resonators S52 indicates that the parallel arm resonators P51 and the series arm resonators S52 share a piezoelectric substrate 570.

The filter 51 is the same wide-band filter as the filter 30 of the first preferred embodiment. Thus, the parallel arm resonators P51 and the series arm resonators S51 of the filter 51 respectively include the piezoelectric substrate 570 and a piezoelectric substrate 580 that are different, similarly to the first preferred embodiment. In FIG. 9, the parallel arm resonators P51 is circled with a ring (reference numeral 570), and the series arm resonators S51 are circled with a ring (reference numeral 580) different from the ring (reference numeral 570). This indicates that the parallel arm resonators P51 and the series arm resonators S51 respectively include the different piezoelectric substrates 570 and 580.

(3) Specific Example of Filter Device

Figure 10:
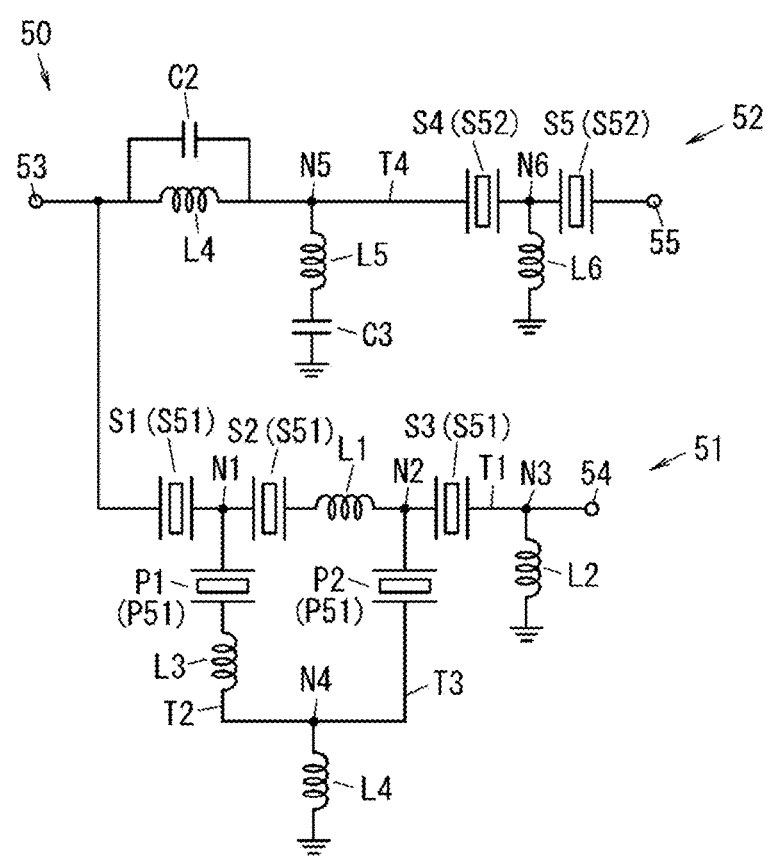
FIG. 10 is a circuit diagram illustrating an example of a circuit configuration of the filter device according to the second preferred embodiment of the present invention.

The following describes an example of a circuit configuration of the filter device 50 according to the second preferred embodiment with reference to FIG. 10. As illustrated in FIG. 10, the filter device 50 includes the filters 51 and 52, and the input-output terminals 53 to 55. The filter 51 is provided in a signal path T1 connecting the input-output terminals 53 and 54. The filter 52 is provided in a signal path T4 connecting the input-output terminals 53 and 55.

Because the filter 51 has the same or substantially the same circuit configuration as the filter 30 of the first preferred embodiment, the filter 51 is illustrated with the same reference numerals as in the configuration of the filter 30 of the first preferred embodiment, and descriptions thereof are not repeated. In FIG. 10, the series arm resonators S1 to S3 correspond to the series arm resonators S51 in FIG. 9, and the parallel arm resonators P1 and P2 correspond to the parallel arm resonators P51 in FIG. 9.

The filter 52 includes series arm resonators S4 and S5, inductors L4 to L6, and capacitors C2 and C3. The series arm resonators S4 and S5 are coupled in series with each other in the signal path T4 between the input-output terminals 53 and 55. The inductor L4 and the capacitor C2 are coupled in parallel with each other between the input-output terminal 53 and the series arm resonator S4 to define an LC parallel resonant circuit. The inductor L5 and the capacitor C3 are coupled in series with each other between a node N5 in the signal path T4 and the ground to form an LC series resonant circuit. The node N5 is located between the inductor L4 and the series arm resonator S4. The inductor L6 is coupled between a node N6 in the signal path T4 and the ground. The node N6 is located between the series arm resonators S4 and S5. In this configuration, the series arm resonators S4 and S5 correspond to the series arm resonators S52 in FIG. 9.

In this circuit configuration, the series arm resonators S1 to S3 (S51) of the filter 51 and the parallel arm resonators P1 and P2 (P51) of the filter 51 separately include different piezoelectric substrates, similarly to the first preferred embodiment. The parallel arm resonators P1 and P2 (P51) of the filter 51 and the series arm resonators S4 and S5 (S52) of the filter 52 share a piezoelectric substrate.

Figure 11:
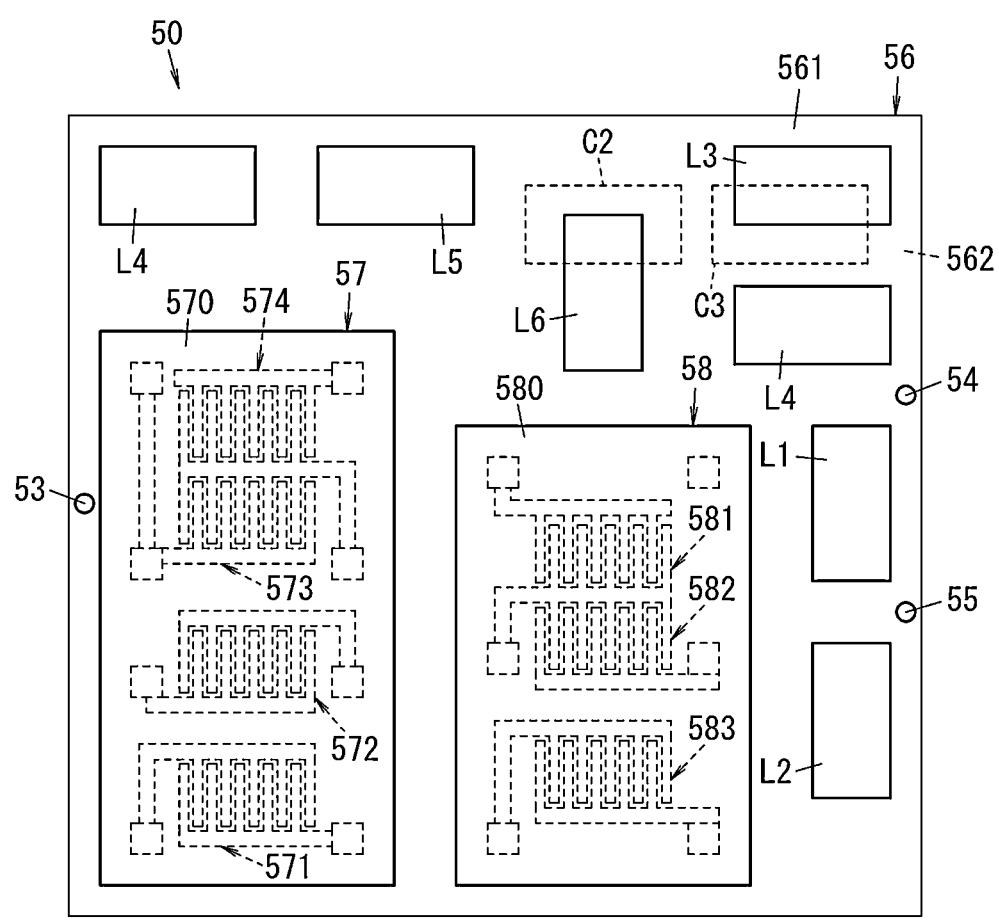
FIG. 11 is a plan view illustrating an example of the separated configuration of piezoelectric substrates of the filter device according to the second preferred embodiment of the present invention.

Specifically, as illustrated in FIG. 11, the filter device 50 includes a filter substrate 56, acoustic wave resonator chips 57 and 58, the inductors L1 to L6 described above, and the capacitors C2 and C3 described above.

The filter substrate 56 includes a first major surface 561 and a second major surface 562. At the first major surface 561 of the filter substrate 56, for example, the acoustic wave resonator chips 57 and 58, the inductors L1 to L6, and the input-output terminals 53 to 55 are provided. At the second major surface 562 of the filter substrate 56, for example, the capacitors C2 and C3 are provided.

The acoustic wave resonator chip 57 is a chip including the parallel arm resonators P1 and P2 (P51) of the filter 51 and the series arm resonators S4 and S5 (S52) of the filter 52 that are formed using the shared piezoelectric substrate 570. The acoustic wave resonator chip 57 includes the shared piezoelectric substrate 570, IDT electrodes 571 and 572 of the respective parallel arm resonators P1 and P2 (P51), and IDT electrodes 573 and 574 of the series arm resonators S4 and S5 (S52). The shared piezoelectric substrate 570 includes two major surfaces. Of the two major surfaces, the IDT electrodes 571 to 574 are provided at a major surface on one side (for example, the filter substrate 56 side). The parallel arm resonators P1 and P2 include the piezoelectric substrate 570 and the respective IDT electrodes 571 and 572. The series arm resonators S4 and S5 (S52) include the piezoelectric substrate 570 and the respective IDT electrodes 573 and 574. This means that the parallel arm resonators P1 and P2 (P51) and the series arm resonators S4 and S5 (S52) share the piezoelectric substrate 570.

The acoustic wave resonator chip 58 is a chip including the series arm resonators S1 to S3 (S51) of the filter 51 that include the shared piezoelectric substrate 580. The acoustic wave resonator chip 58 includes the shared piezoelectric substrate 580 and IDT electrodes 581 to 583 of the respective series arm resonators S1 to S3 (S51). The shared piezoelectric substrate 580 includes two major surfaces. Of the two major surfaces, the IDT electrodes 581 to 583 are provided at a major surface on one side (for example, the filter substrate 56 side). The series arm resonators S1 to S3 (S51) include the piezoelectric substrate 580 and the respective IDT electrodes 581 to 583. This means that the series arm resonators S1 to S3 (S51) share the piezoelectric substrate 580. The piezoelectric substrate 580 of the series arm resonators S1 to S3 (S51) and the piezoelectric substrate 570 of the parallel arm resonators P1 and P2 (P51) and the series arm resonators S4 and S5 (S52) are different (that is, separate).

(4) Main Advantageous Effects

In the filter device 50 of the present preferred embodiment, the piezoelectric substrate 580 of the series arm resonators S51 of the filter 51 is different from the piezoelectric substrate 570 of the parallel arm resonators P51. Thus, similarly to the first preferred embodiment, it is possible to easily achieve desired filter characteristics. As such, degradation of filter characteristics is reduced or prevented.

Furthermore, because the parallel arm resonators P51 of the filter 51 and the series arm resonators S52 of the filter 52 share the piezoelectric substrate 570, the size of the filter device 50 including the filters 51 and 52 is reduced.

In the present preferred embodiment, the pass band 510 of the filter 51 is higher than the pass band 520 of the filter 52, but the pass band 510 of the filter 51 may be lower than the pass band 520 of the filter 52. In this case, the series arm resonators S51 of the filter 51 and the parallel resonators of the filter 52 share a piezoelectric substrate.

Third Preferred Embodiment

Figure 12:
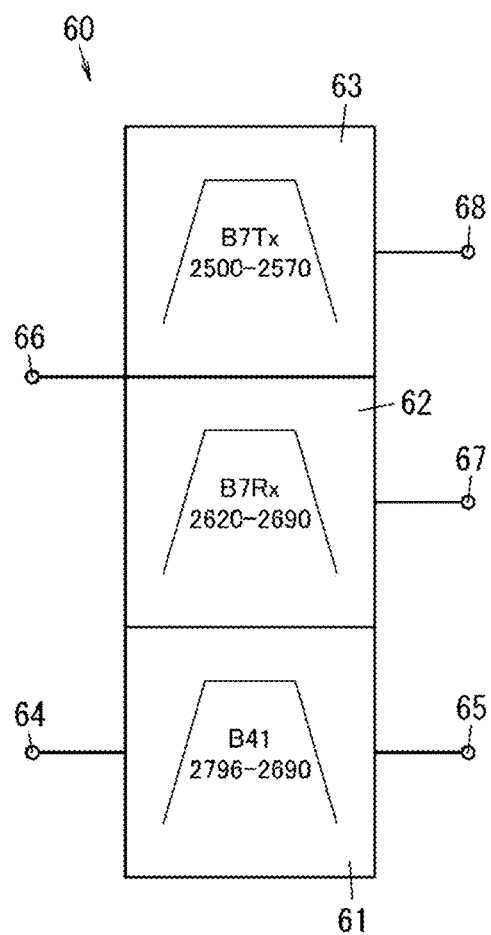
FIG. 12 is a schematic diagram of a configuration of a filter device according to a third preferred embodiment of the present invention.
Figure 13:
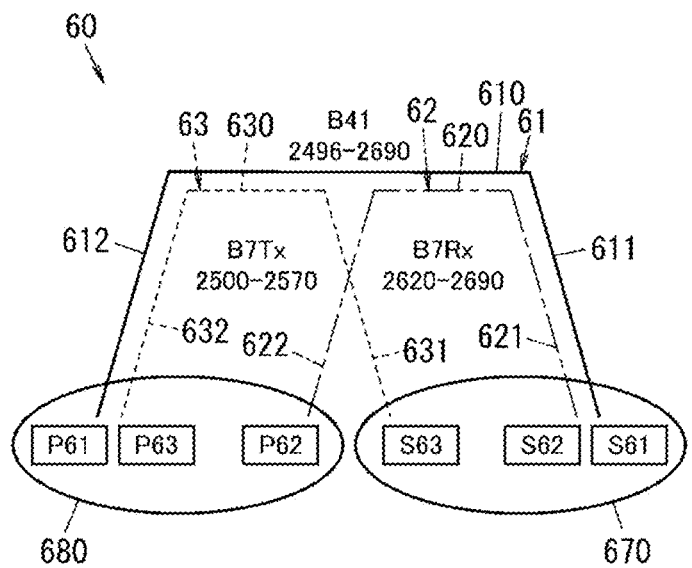
FIG. 13 shows a separated configuration of piezoelectric substrates of the filter device according to the third preferred embodiment of the present invention.

The following describes a filter device 60 according to a third preferred embodiment of the present invention with reference to FIGS. 12 and 13. In the second preferred embodiment, of the two filters 51 and 52, acoustic wave resonators having close resonant frequencies include a shared piezoelectric substrate. In the third preferred embodiment, of three filters 61 to 63 (first to third filters), acoustic wave resonators having close resonant frequencies include a shared piezoelectric substrate. In the following description, the same or corresponding elements as the first or second preferred embodiment are assigned the same reference numerals as in the first or second preferred embodiment, and descriptions thereof are not repeated. The main focus in the following description is on points different from the first or second preferred embodiment.

(1) Outline

The filter device 60 of the third preferred embodiment is a two-input three-output filter including a wide-band filter 61 and non-wide-band filters 62 and 63 (see FIG. 12). In the filter device 60, the filter 30 of the first preferred embodiment is used as the filter 61. A pass band 610 of the filter 61 includes pass bands 620 and 630 of the filters 62 and 63 (see FIG. 13). With this configuration, of the filters 61 to 63, parallel arm resonators P61 to P63 share a piezoelectric substrate 680, and series arm resonators S61 to S63 share a piezoelectric substrate 670 (see FIG. 13).

Specifically, in the filter 61, similarly to the filter 30 of the first preferred embodiment, the series arm resonators S61 and the parallel arm resonators P61 respectively include the different piezoelectric substrates 670 and 680. Further, in the present preferred embodiment, the resonant frequencies of the parallel arm resonators P62 and P63 of the filters 62 and 63 are close to the resonant frequency of the parallel arm resonators P61 of the filter 61. The parallel arm resonators P61, P62, and P63 of the filters 61, 62, and 63 thus include the shared piezoelectric substrate 680. Similarly, the anti-resonant frequencies of the series arm resonators S62 and S63 of the filters 62 and 63 are close to the anti-resonant frequency of the series arm resonators S61 of the filter 61. The series arm resonators S61, S62, and S63 of the filters 61, 62, and 63 thus include the shared piezoelectric substrate 670. The following describes the filter device 60 in detail.

(2) Description of Details

As illustrated in FIG. 12, the filter device 60 includes the two filters 61 to 63, five input-output terminals 64 to 68, and a filter substrate. The two filters 61 to 63 and the five input-output terminals 64 to 68 are provided at the filter substrate.

The input-output terminals 64 to 68 are terminals to input or output signals (transmit signals or receive signals) to or from the filter device 60. The input-output terminals 64 and 65 are coupled to the filter 61. The input-output terminal 66 is coupled to the filters 62 and 63 in a shared manner. The input-output terminals 67 and 68 are respectively coupled to the filters 62 and 63.

The filter 61 is a wide-band band-pass filter having, for example, a fractional bandwidth of about 7% or more and a pass band of about 3 GHz or lower. The filter 61 has a pass band that allows signals in a first frequency band (for example, Band 41 (about 2496 MHz-about 2690 MHz)) to pass. The filter 62 is a non-wide-band receive filter. The filter 62 has a pass band that allows signals in a second frequency band (for example, Band 7 downlink frequency band (about 2620 MHz-about 2690 MHz)) to pass. The filter 63 is a non-wide-band transmit filter. The filter 63 has a pass band that allows a third frequency band (for example, Band 7 uplink frequency band (about 2500 MHz-about 2570 MHz)) to pass. The first frequency band includes the second frequency band and the third frequency band. The second frequency band is higher than the third frequency band.

The filter 61 limits signals inputted to the input-output terminal 64 to the pass band and outputs the signals from the input-output terminal 65. The filter 61 also limits signals inputted to the input-output terminal 65 to the pass band and outputs the signals from the input-output terminal 64. The filter 62 limits signals inputted to the input-output terminal 66 to the pass band and outputs the signals from the input-output terminal 67. The filter 63 also limits signals inputted to the input-output terminal 68 to the pass band and outputs the signals from the input-output terminal 66.

As illustrated in FIG. 13, the filter 61 has the pass band 610, and attenuation bands 611 and 612. The pass band 610 is a frequency band that allows signals in the first frequency band (for example, Band 41) to pass. The attenuation band 611 is a frequency band with a steep attenuation slope on the higher frequency side with respect to the pass band 610. The attenuation band 612 is a frequency band with a steep attenuation slope on the lower frequency side with respect to the pass band 610. The filter 61 is a ladder filter including multiple acoustic wave resonators including the series arm resonators S61 and the parallel arm resonators P61. The anti-resonant frequency of the series arm resonators S61 of the filter 61 provides the attenuation band 611 on the higher frequency side with respect to the filter 61. The resonant frequency of the parallel arm resonators P61 of the filter 61 provides the attenuation band 612 on the lower frequency side with respect to the filter 61.

The filter 62 has the pass band 620, and attenuation bands 621 and 622. The pass band 620 is a frequency band that allows signals in the second frequency band (for example, Band 7 downlink frequency band) to pass. The attenuation band 621 is a frequency band with a steep attenuation slope on the higher frequency side with respect to the pass band 620. The attenuation band 622 is a frequency band with a steep attenuation slope on the lower frequency side with respect to the pass band 620. The filter 62 is a ladder filter including multiple acoustic wave resonators including the series arm resonators S62 and the parallel arm resonators P62. The anti-resonant frequency of the series arm resonators S62 of the filter 62 provides the attenuation band 621 on the higher frequency side with respect to the filter 62. The resonant frequency of the parallel arm resonators P62 of the filter 62 provides the attenuation band 622 on the lower frequency side with respect to the filter 62.

The filter 63 has the pass band 630, and attenuation bands 631 and 632. The pass band 630 is a frequency band that allows signals in the third frequency band (for example, Band 7 uplink frequency band) to pass. The attenuation band 631 is a frequency band with a steep attenuation slope on the higher frequency side with respect to the pass band 630. The attenuation band 632 is a frequency band with a steep attenuation slope on the lower frequency side with respect to the pass band 630. The filter 63 is a ladder filter including multiple acoustic wave resonators including the series arm resonators S63 and the parallel arm resonators P63. The anti-resonant frequency of the series arm resonators S63 of the filter 63 provides the attenuation band 631 on the higher frequency side with respect to the filter 63. The resonant frequency of the parallel arm resonators P63 of the filter 63 provides the attenuation band 632 on the lower frequency side with respect to the filter 63.

The pass band 610 of the filter 61 includes the pass band 620 of the filter 62 and the pass band 630 of the filter 63. The attenuation band 611 on the higher frequency side with respect to the filter 61 and the attenuation band 621 on the higher frequency side with respect to the filter 62 are continuously adjacent to each other. The attenuation band 612 on the lower frequency side with respect to the filter 61 and the attenuation band 632 on the lower frequency side with respect to the filter 63 are continuously adjacent to each other. The attenuation band 622 on the lower frequency side with respect to the filter 62 overlaps the attenuation band 631 on the higher frequency side with respect to the filter 63. This means that the resonant frequency of the parallel arm resonators P62 providing the attenuation band 622 on the lower frequency side with respect to the filter 62 is lower than the anti-resonant frequency of the series arm resonators S63 providing the attenuation band 631 on the higher frequency side with respect to the filter 63. It should be noted that the expression "two pass bands are continuously adjacent to each other" has been defined in the second preferred embodiment.

The filter 61 is a wide-band filter configured in the same or substantially the same manner as the filter 30 of the first preferred embodiment. Thus, the parallel arm resonators P61 and the series arm resonators S61 of the filter 61 respectively include the different piezoelectric substrates 670 and 680, similarly to the first preferred embodiment. In FIG. 13, the parallel arm resonators P61 is circled with a ring (reference numeral 680), and the series arm resonators S61 is circled with a ring (reference numeral 670) different from the ring (reference numeral 680). This indicates that the parallel arm resonators P61 and the series arm resonators S61 respectively include the different piezoelectric substrates 680 and 670.

The attenuation bands 611 and 621 on the higher frequency side with respect to the respective filters 61 and 62 are continuously adjacent to each other. The filter 62 is a non-wide-band filter, and additionally, as described above, the anti-resonant frequency of the series arm resonators S63 of the filter 63 is higher than the resonant frequency of the parallel arm resonators P62 of the filter 62. As a result, the anti-resonant frequencies the series arm resonators S61 to S63 of the filters 61 to 63 are close to each other. In the present preferred embodiment, the series arm resonators S61 to S63 of the filters 61 to 63 thus include the shared piezoelectric substrate 670, similarly to the second preferred embodiment. In other words, the series arm resonators S61 to S63 of the filters 61 to 63 share the piezoelectric substrate 670. In FIG. 13, the ring (reference numeral 670) drawn around the series arm resonators S61 to S63 indicates that the series arm resonators S61 to S63 share the piezoelectric substrate 670.

The attenuation bands 612 and 632 on the lower higher frequency side with respect to the respective filters 61 and 63 are continuously adjacent to each other. The filter 63 is a non-wide-band filter, and additionally, as described above, the resonant frequency of the parallel arm resonators P62 of the filter 62 is lower than the anti-resonant frequency of the series arm resonators S63 of the filter 63. As a result, the resonant frequencies of the parallel arm resonators P61 to P63 of the filters 61 to 63 are close to each other. In the present preferred embodiment, the parallel arm resonators P61 to P63 of the filters 61 to 63 thus include the shared piezoelectric substrate 680, similarly to the second preferred embodiment. In other words, the parallel arm resonators P61 to P63 of the filters 61 to 63 share the piezoelectric substrate 680. The shared piezoelectric substrate 680 of the parallel arm resonators P61 to P63 is different from the shared piezoelectric substrate 670 of the series arm resonators S61 to S63. In FIG. 13, the ring (reference numeral 680) drawn around the parallel arm resonators P61 to P63 indicates that the parallel arm resonators P61 to P63 share the piezoelectric substrate 680.

(3) Main Advantageous Effects

In the filter device 60 of the present preferred embodiment, the series arm resonators S61 and the parallel arm resonators P61 of the filter 61 respectively include the different piezoelectric substrates 670 and 680. Thus, similarly to the first preferred embodiment, it is possible to achieve a wide pass band while reducing or preventing degradation of filter characteristics.

The parallel arm resonators P61 to P63 of the filters 61 to 63 share the piezoelectric substrate 680. The series arm resonators S61 to S63 of the filters 61 to 63 include the piezoelectric substrate 670 that is a shared piezoelectric substrate and that is different from the piezoelectric substrate 680 of the parallel arm resonators P61 to P63. As a result, it is possible to reduce the size of the filter device 60 including the filters 61 and 52.

(4) Modification of Third Preferred Embodiment

Figure 14:
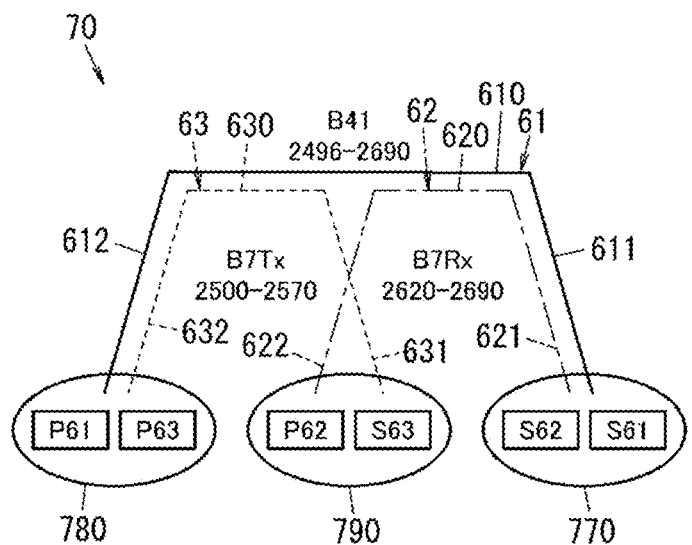
FIG. 14 shows a separated configuration of piezoelectric substrates of a filter device according to a modification of the third preferred embodiment of the present invention.

The following describes a filter device 70 according to a first modification of the third preferred embodiment of the present invention with reference to FIG. 14. The same or corresponding elements as the third preferred embodiment are assigned the same reference numerals, and descriptions thereof are not repeated. The main focus in the following description is on elements different from the third preferred embodiment.

In the third preferred embodiment, the attenuation bands 611 and 621 on the higher frequency side with respect to the respective filters 61 and 62 are continuously adjacent to each other. For this reason, as in this modification illustrated in FIG. 14, the series arm resonators S61 and S62 of the filters 61 and 62 may include a shared piezoelectric substrate 770. In other words, the series arm resonators S61 and S62 of the filters 61 and 62 may share the piezoelectric substrate 770. In FIG. 14, a ring (reference numeral 770) drawn around the series arm resonators S61 and S62 indicates that the series arm resonators S61 and S62 share the piezoelectric substrate 770.

Similarly, in the third preferred embodiment, the attenuation bands 612 and 632 on the lower frequency side with respect to the respective filters 61 and 63 are continuously adjacent to each other. For this reason, as in this modification illustrated in FIG. 14, the parallel arm resonators P61 and P63 of the filters 61 and 63 may include a shared piezoelectric substrate 780. In other words, the parallel arm resonators P61 and P63 of the filters 61 and 63 may share the piezoelectric substrate 780. In FIG. 14, a ring (reference numeral 780) drawn around the parallel arm resonators P61 and P63 indicates that the parallel arm resonators P61 and P63 share the piezoelectric substrate 780.

In the third preferred embodiment, the attenuation band 622 on the lower frequency side with respect to the filter 62 overlaps the attenuation band 631 on the higher frequency side with respect to the filter 63. For this reason, as in this modification illustrated in FIG. 14, the parallel arm resonators P62 of the filter 62 and the series arm resonators S63 of the filter 63 may include a shared piezoelectric substrate 790. In other words, the parallel arm resonators P62 of the filter 62 and the series arm resonators S63 of the filter 63 may share the piezoelectric substrate 790. The shared piezoelectric substrate 790 is different from the piezoelectric substrate 770 of the series arm resonators S61 of the filter 61 and the piezoelectric substrate 780 of the parallel arm resonators P61 of the filter 61. In FIG. 14, a ring (reference numeral 790) drawn around both of the parallel arm resonators P62 and the series arm resonators S63 indicates that the parallel arm resonators P62 and the series arm resonators S63 share the piezoelectric substrate 790.

In the filter device 70 of the present preferred embodiment, the series arm resonators S61 and the series arm resonators P61 of the filter 61 respectively include the different piezoelectric substrates 770 and 780. Thus, similarly to the first preferred embodiment, it is possible to achieve a wide pass band while reducing or preventing degradation of filter characteristics.

Further, the series arm resonators S61 and S62 of the filters 61 and 62 share the piezoelectric substrate 770. The parallel arm resonators P61 and P63 of the filters 61 and 63 share the piezoelectric substrate 780. The parallel arm resonators P62 of the filter 62 and the series arm resonators S63 of the filter 63 share the piezoelectric substrate 790. As a result, it is possible to reduce the size of the filter device 70 including the filters 61 and 62.

In this modification, the anti-resonant frequency of the series arm resonators S63 of the filter 63 is higher than the resonant frequency of the parallel arm resonators P62 of the filter 62. However, the anti-resonant frequency of the series arm resonators S63 of the filter 63 may be lower than the resonant frequency of the parallel arm resonators P62 of the filter 62.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a substrate; and
a ladder filter at the substrate; wherein
the ladder filter includes:
  a plurality of acoustic wave resonators including a plurality of series arm resonators and a plurality of parallel arm resonators; and
  at least one inductor coupled to the plurality of acoustic wave resonators;
a pass bandwidth of the ladder filter is larger than a resonance bandwidth of at least one acoustic wave resonator of the plurality of acoustic wave resonators;
the plurality of series arm resonators include interdigital transducer (IDT) electrodes provided on a first piezoelectric substrate;
the plurality of parallel arm resonators include IDT electrodes provided on a second piezoelectric substrate different from the first piezoelectric substrate;
the ladder filter is a first filter having a first pass band that allows signals in a first frequency band to pass;
the filter device further includes a second filter at the substrate and having a second pass band that allows signals in a second frequency band to pass and that is lower than the first pass band;
the second filter includes a plurality of acoustic wave resonators at least including a series arm resonator;
an attenuation band on a lower frequency side with respect to the first filter and an attenuation band on a higher frequency side with respect to the second filter are continuously adjacent to each other; and
the plurality of parallel arm resonators of the first filter and the series arm resonator of the second filter share the second piezoelectric substrate as a shared piezoelectric substrate.

2. The filter device according to claim 1, wherein the ladder filter includes a capacitor coupled to the at least one inductor.

3. A filter device comprising:
a substrate; and
a ladder filter at the substrate; wherein
the ladder filter includes:
  a plurality of acoustic wave resonators including a series arm resonator and a parallel arm resonator; and
  at least one inductor coupled to the plurality of acoustic wave resonators;
a pass bandwidth of the ladder filter is larger than a resonance bandwidth of at least one acoustic wave resonator of the plurality of acoustic wave resonators;
the series arm resonator includes a first piezoelectric substrate;
the parallel arm resonator includes a second piezoelectric substrate different from the first piezoelectric substrate; and
of the plurality of acoustic wave resonators, an acoustic wave resonator at a shortest distance along a signal path from an antenna terminal coupled to an antenna includes a third piezoelectric substrate that is different from the first piezoelectric substrate and the second piezoelectric substrate.

4. A filter device comprising:
a substrate; and
a ladder filter at the substrate; wherein
the ladder filter includes:
  a plurality of acoustic wave resonators including a series arm resonator and a parallel arm resonator; and
  at least one inductor coupled to the plurality of acoustic wave resonators;
a pass bandwidth of the ladder filter is larger than a resonance bandwidth of at least one acoustic wave resonator of the plurality of acoustic wave resonators;
the series arm resonator of the ladder filter includes a first interdigital transducer (IDT) electrode and a first piezoelectric substrate;
the parallel arm resonator of the ladder filter includes a second IDT electrode and a second piezoelectric substrate different from the first piezoelectric substrate; and
an electrode pitch of the first IDT electrode is smaller than an electrode pitch of the second IDT electrode.

5. A radio-frequency module comprising:
the filter device according to claim 1; and
a mounting board including the filter device.

6. The radio-frequency module according to claim 5, wherein the ladder filter includes a capacitor coupled to the at least one inductor.

7. The radio-frequency module according to claim 5, wherein, of the plurality of acoustic wave resonators, an acoustic wave resonator at a shortest distance along a signal path from an antenna terminal coupled to an antenna includes a third piezoelectric substrate that is different from the first piezoelectric substrate and the second piezoelectric substrate.

8. The radio-frequency module according to claim 5, wherein
the IDT electrodes of the plurality of series arm resonators of the ladder filter includes a first interdigital transducer (IDT) electrode;
the IDT electrodes of the plurality of parallel arm resonators of the ladder filter includes a second IDT electrode; and
an electrode pitch of the first IDT electrode is smaller than an electrode pitch of the second IDT electrode.

9. A communication device comprising:
the radio-frequency module according to claim 5; and
a signal processing circuit coupled to the radio-frequency module to process a radio-frequency signal.

10. The communication device according to claim 9, wherein the ladder filter includes a capacitor coupled to the at least one inductor.

11. The communication device according to claim 9, wherein, of the plurality of acoustic wave resonators, an acoustic wave resonator at a shortest distance along a signal path from an antenna terminal coupled to an antenna includes a third piezoelectric substrate that is different from the first piezoelectric substrate and the second piezoelectric substrate.

\* \* \* \* \*